(12) United States Patent
Toyoda

(10) Patent No.: US 11,088,340 B2
(45) Date of Patent: Aug. 10, 2021

(54) DISPLAY DEVICE AND METHOD FOR MANUFACTURING DISPLAY DEVICE

(71) Applicant: Japan Display Inc., Minato-ku (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 53 days.

(21) Appl. No.: 15/919,243

(22) Filed: Mar. 13, 2018

(65) Prior Publication Data

US 2018/0294423 A1    Oct. 11, 2018

(30) Foreign Application Priority Data

Apr. 7, 2017    (JP) .............................. JP2017-076529

(51) Int. Cl.
| | |
|---|---|
| *H01L 51/50* | (2006.01) |
| *H01L 51/56* | (2006.01) |
| *H01L 27/32* | (2006.01) |
| *H01L 51/52* | (2006.01) |
| *H01L 51/00* | (2006.01) |

(52) U.S. Cl.
CPC .......... *H01L 51/506* (2013.01); *H01L 27/322* (2013.01); *H01L 27/3246* (2013.01); *H01L 51/002* (2013.01); *H01L 51/5012* (2013.01); *H01L 51/5064* (2013.01); *H01L 51/5072* (2013.01); *H01L 51/5092* (2013.01); *H01L 51/5096* (2013.01); *H01L 51/524* (2013.01); *H01L 51/5218* (2013.01); *H01L 51/5234* (2013.01); *H01L 51/56* (2013.01); *H01L 2251/5346* (2013.01); *H01L 2251/558* (2013.01)

(58) Field of Classification Search
CPC ......... H01L 51/50; H01L 27/32; H01L 51/52; H01L 51/56
See application file for complete search history.

(56) References Cited

U.S. PATENT DOCUMENTS

| | | | |
|---|---|---|---|
| 2004/0251816 A1 | 12/2004 | Leo et al. | |
| 2004/0265630 A1* | 12/2004 | Suh ..................... | H01L 51/5052 428/690 |
| 2007/0052351 A1* | 3/2007 | Kim ..................... | H01L 51/5052 313/506 |
| 2009/0058283 A1* | 3/2009 | Tanaka ................ | H01L 51/5218 313/504 |
| 2013/0175508 A1* | 7/2013 | Kwon ................. | H01L 27/3211 257/40 |
| 2013/0207084 A1* | 8/2013 | Im ....................... | H01L 27/3211 257/40 |

(Continued)

FOREIGN PATENT DOCUMENTS

JP    2004-537149    12/2004

*Primary Examiner* — Sheng-Bai Zhu
(74) *Attorney, Agent, or Firm* — Oblon, McClelland, Maier & Neustadt, L.L.P.

(57) ABSTRACT

To provide a display device including a light emitting element layer including an anode electrode, a light emissive layer formed on the anode electrode, and a cathode electrode formed on the light emissive layer, and a bank formed on the lower electrode and having an opening, in which the lower electrode is partially exposed, wherein the light emissive layer includes a p-doped hole transport layer containing p-dopant, and the p-doped hole transport layer contains a larger amount of p-dopant in an area close to an end portion of the opening of the bank than the amount of p-dopant contained in other areas.

6 Claims, 13 Drawing Sheets

(56) References Cited

U.S. PATENT DOCUMENTS

| | | | |
|---|---|---|---|
| 2014/0312336 A1* | 10/2014 | Abe | H01L 51/5008 257/40 |
| 2015/0041780 A1* | 2/2015 | Ma | H01L 51/0072 257/40 |
| 2015/0155516 A1* | 6/2015 | Yamashita | H01L 51/56 257/40 |
| 2017/0098782 A1* | 4/2017 | Choi | H01L 51/508 |
| 2017/0338438 A1* | 11/2017 | Kwon | H01L 51/5228 |

* cited by examiner

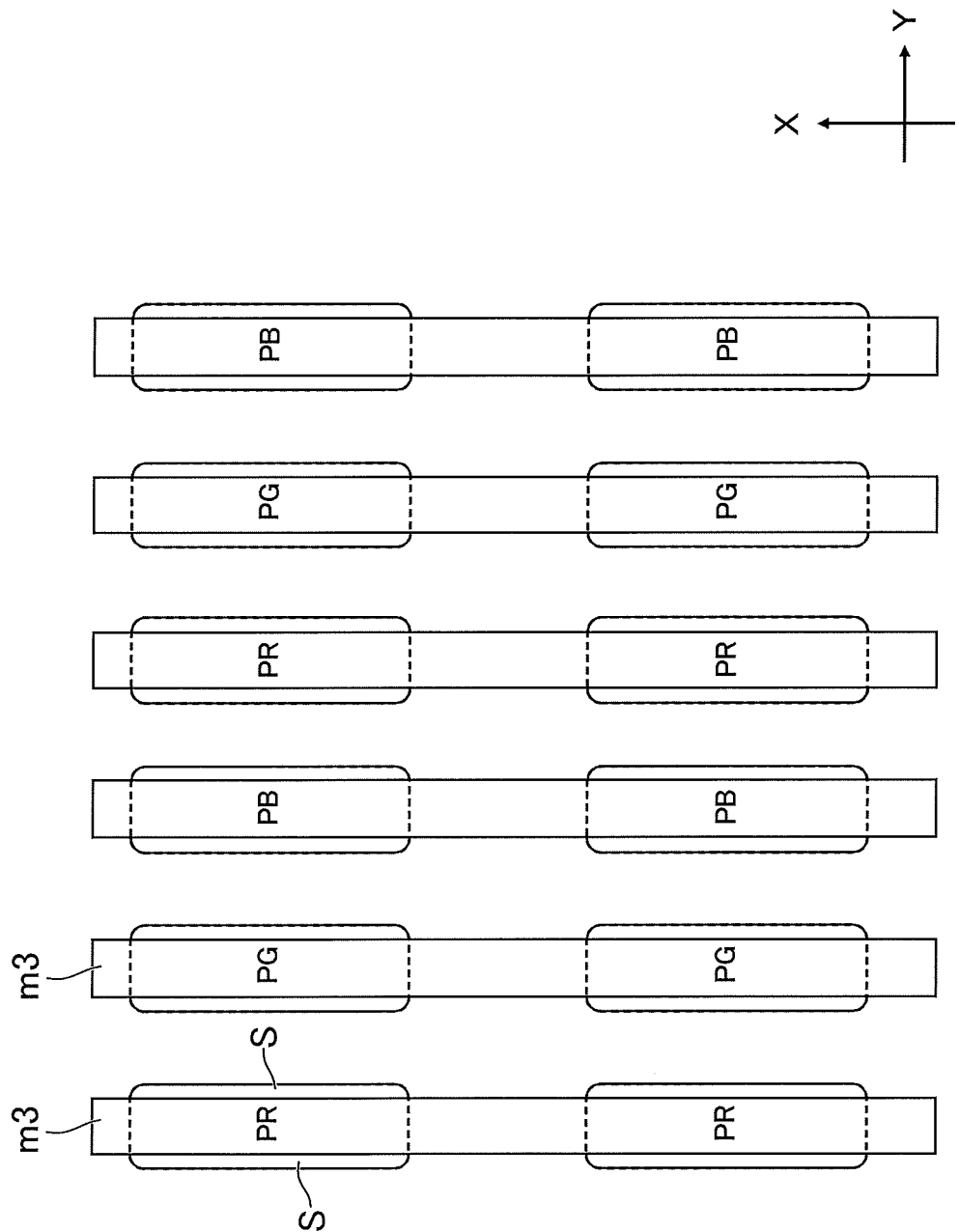

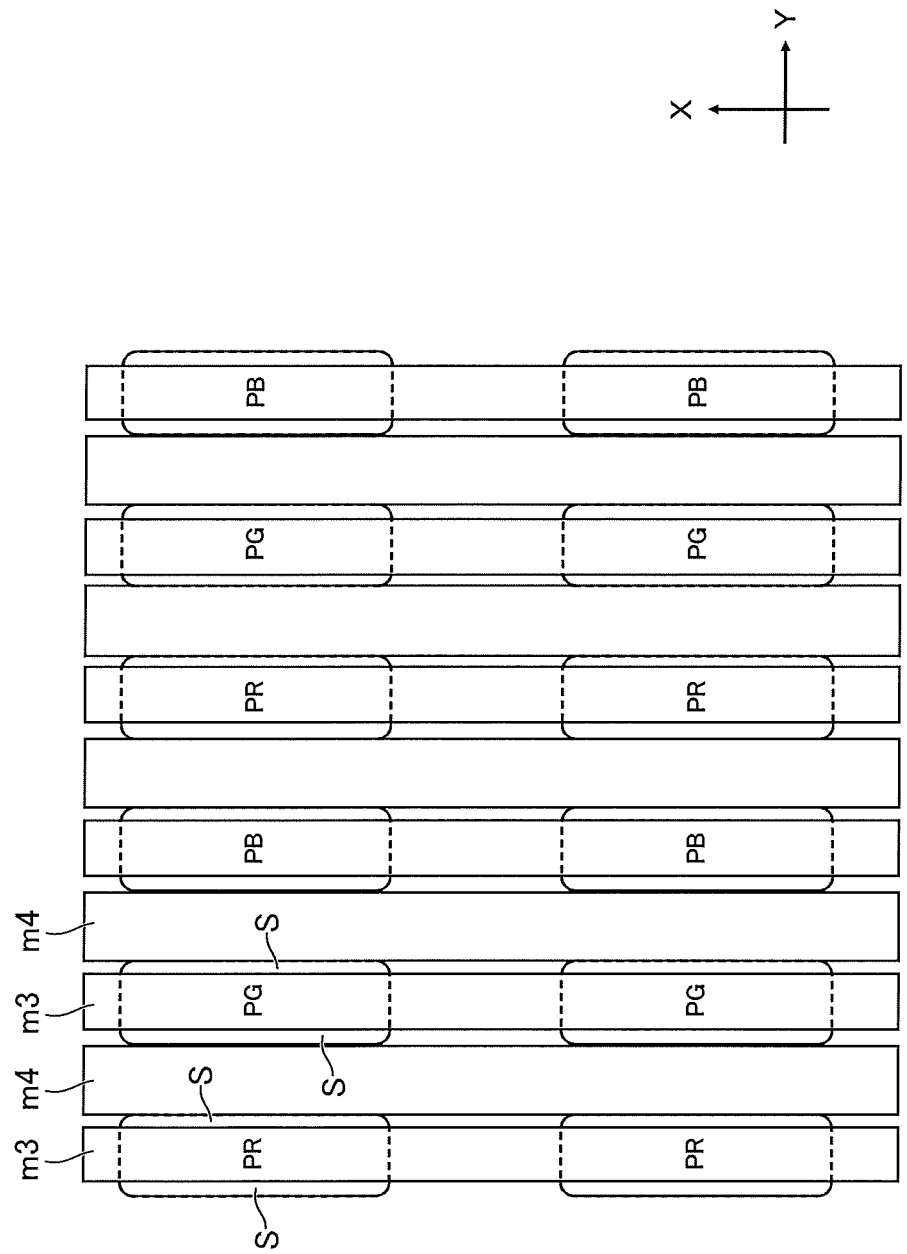

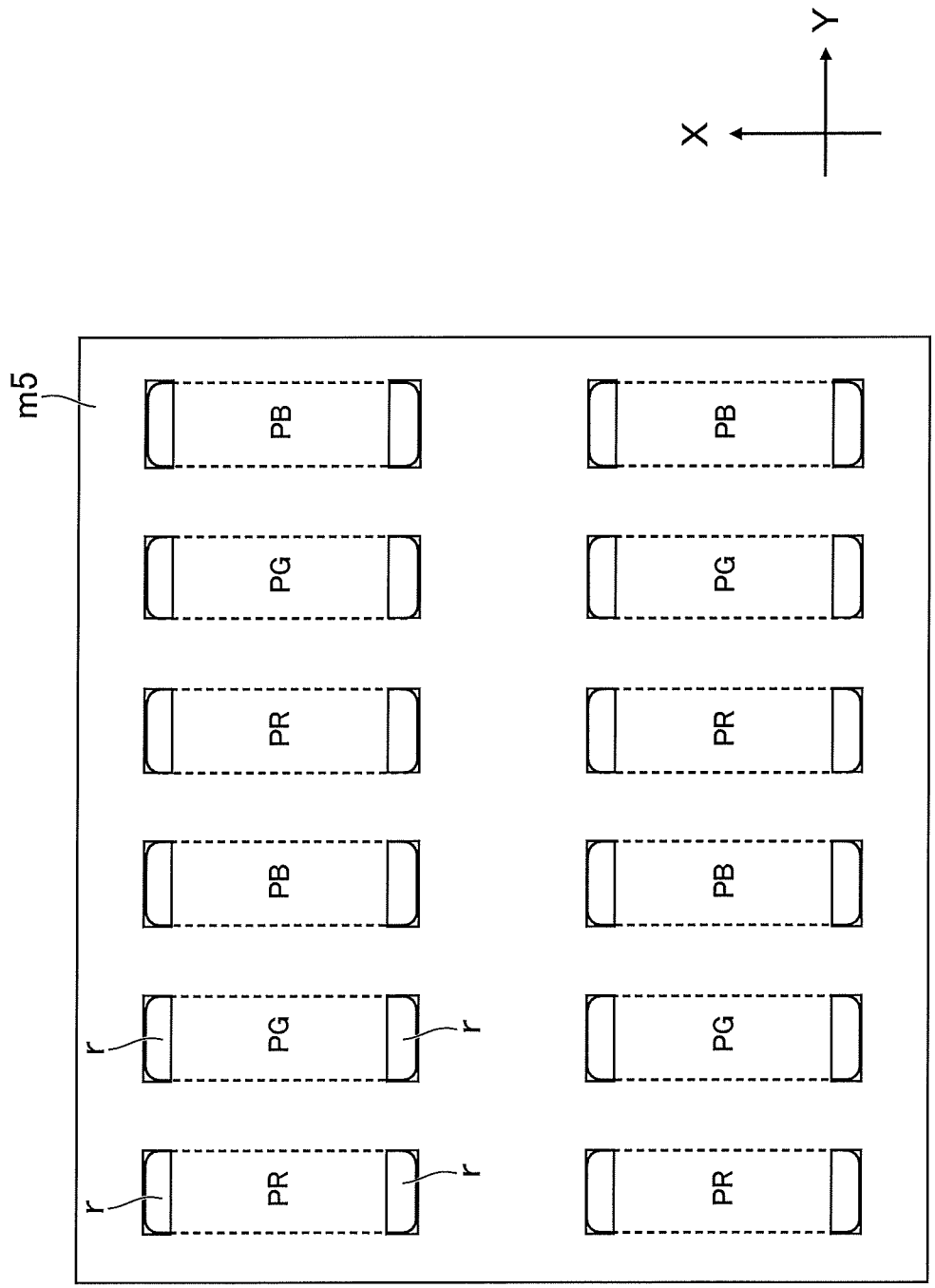

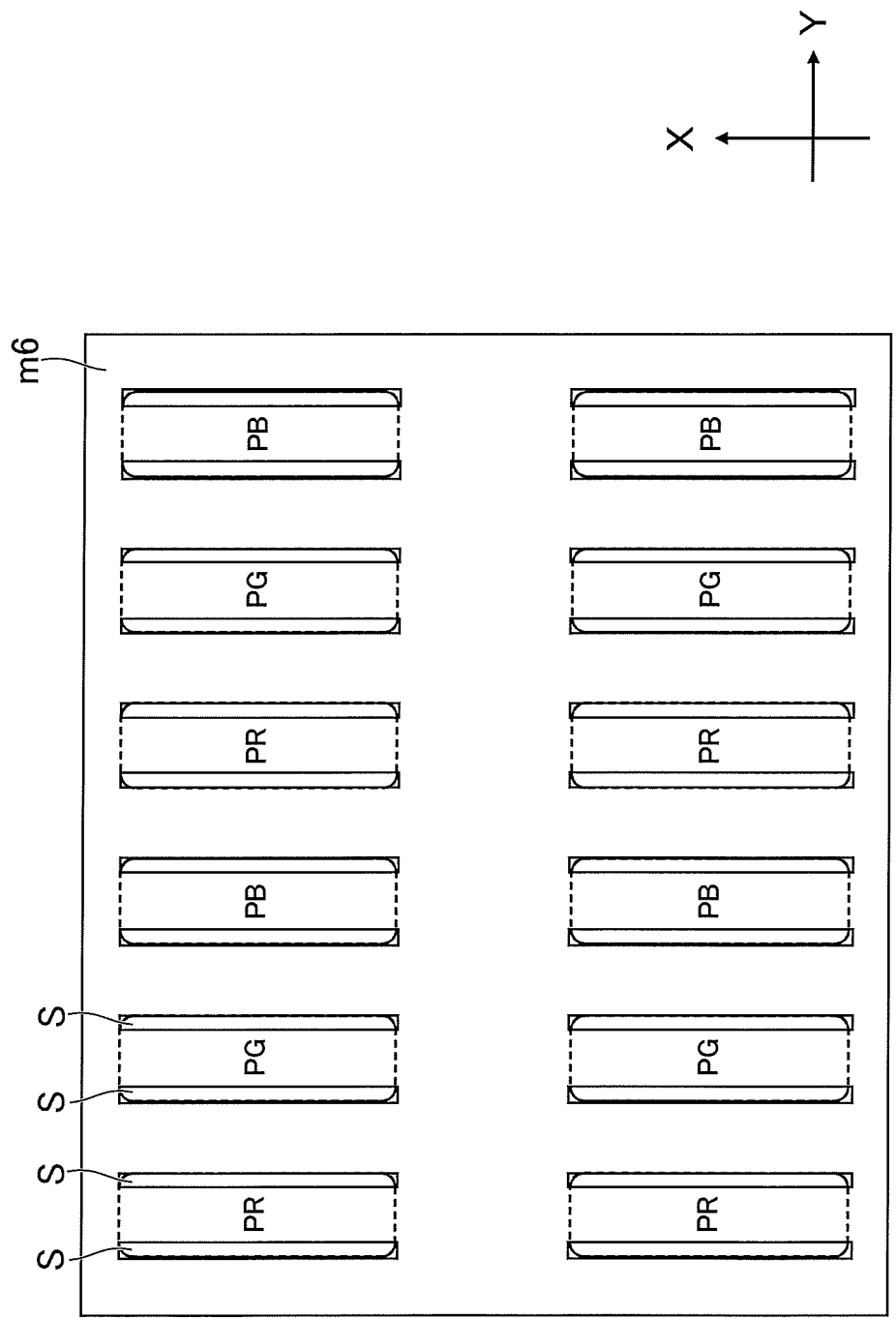

DISPLAY DEVICE AND METHOD FOR MANUFACTURING DISPLAY DEVICE

CROSS-REFERENCE TO RELATED APPLICATION

The present application claims priority from Japanese application JP2017-076529 filed on Apr. 7, 2017, the content of which is hereby incorporated by reference into this application.

BACKGROUND OF THE INVENTION

1. Field of the Invention

The present invention relates to display devices and a method for manufacturing the display devices.

2. Description of the Related Art

Some display devices include a light emitting element layer including an anode electrode (a lower electrode), a light emissive layer formed on the anode electrode, and a cathode electrode (an upper electrode) formed on the light emissive layer. On the anode electrode, a bank having an opening is formed with the anode electrode partially exposed in the opening. In such a display device, a pixel is formed in an area with the anode electrode exposed in the opening of the bank, and emits light. A light emissive layer having a p-doped hole transport layer formed by injecting p-dopant into a hole transport layer is known (for example, JP2004-537149A). A p-doped hole transport layer generates holes and transports the holes to the light emissive layer.

In the above, the anode electrode and the cathode electrode are prevented from being short-circuited to each other by so-called reflow soldering. In reflow soldering, a film is melted to therewith cover a foreign body on the anode electrode. Reflow soldering applied after formation of a p-doped hole transport layer on the anode electrode, however, causes the reflow material to be agglomerated around the end portion of the opening of the bank. The agglomerated material increases the thickness of the p-doped hole transport layer in an area around the end portion of the opening of the bank, and the hole transport capability decreases in the area with the thicker layer. This makes a current flowing less easily in the area. The current flowing less easily in an area near the end portion of the opening of the bank reduces the substantial width of the opening of the pixel, which can reduce the brightness of the pixel.

SUMMARY OF THE INVENTION

To address the above problem, it is an object of the present invention to prevent decrease in brightness.

According to one aspect of the present invention, there is provided a display device including a light emitting element layer including a lower electrode, a light emissive layer formed on the lower electrode, and an upper electrode formed on the light emissive layer; and an insulating layer formed on the lower electrode and having an opening, in which the lower electrode is partially exposed, wherein the light emissive layer includes a p-doped hole transport layer containing p-dopant, and the p-doped hole transport layer contains a larger amount of p-dopant in an area close to an end portion of the opening of the insulating layer than an amount of p-dopant contained in other areas.

According to another aspect of the present invention, there is provided a method for manufacturing a display device, the method including a step of forming a lower electrode; a step of forming an insulating layer on the lower electrode, the insulating layer having an opening, in which the lower electrode is partially exposed; a step of forming a hole transport layer on the insulating layer and a part of the lower electrode, the part being exposed in the opening; a step of injecting p-dopant into the hole transport layer to thereby form a p-doped hole transport layer; a step of applying thermal processing to the p-doped hole transport layer; a step of additionally injecting p-dopant into the p-doped hole transport layer in an area close to an end portion of the opening of the insulating layer; a step of forming a light emissive layer on the p-doped hole transport layer; and a step of forming an upper electrode on the light emissive layer.

BRIEF DESCRIPTION OF THE DRAWINGS

FIG. 10 is a plan view to explain a process of injecting p-dopant into a p-doped hole transport layer in a second modified example;

FIG. 11 is a plan view to explain a process of injecting p-dopant into a p-doped hole transport layer in a third modified example;

FIG. 12 is a plan view to explain a process of injecting p-dopant into a p-doped hole transport layer in a fourth modified example; and FIG. 13 is a plan view to explain a process of injecting p-dopant into a p-doped hole transport layer in a fifth modified example.

DETAILED DESCRIPTION OF THE INVENTION

Figure 1:
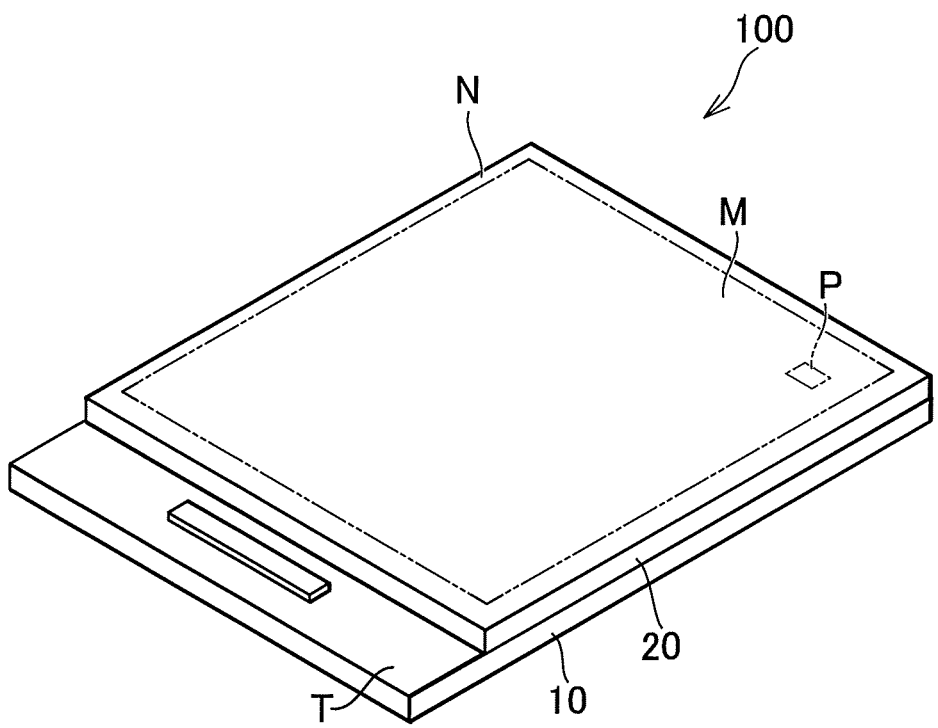
FIG. 1 is a perspective view of a complete structure of a display device according to this embodiment.

The following describes an embodiment of the present invention (hereinafter referred to as this embodiment) while referring to the drawings. The present invention can be rendered into practice in various aspects without departing from the gist of the present invention. The present invention should not be interpreted as being limited to the description of the embodiment below.

The respective widths, thicknesses, shapes, and so forth may be illustrated more schematically in the drawings, compared with actual widths, thicknesses, shapes, and so forth in order to make clearer the description of the present invention. These, however, are mere examples, and should not limit interpretation of the present invention in any way. In the specification and drawings, any elements having the same functions as those having been described earlier with respect to a drawing referred to earlier are given the same reference numerals, and may not be described in detail again.

In the detailed description of an embodiment of the present invention, the terms "on" and "under" appearing in the description that defines positional relationships between structural components refer to not only a case in which a first component is disposed directly on or under a second component but also a case in which a first structural component is disposed on or under a second structural component with a third structural component in-between unless otherwise stated.

FIG. 1 is a schematic perspective view of a complete structure of a display device according to an embodiment. An organic electro-luminescent display device will be described below as an example of a display device. A display device 100 displays a full-color image with combination of pixels P for a plurality of colors, including red, green, and blue. In the description below, each pixel is identified by the letter P, or a letter representing a pixel, followed by letters R, G, B representing respective colors (for example, a red pixel P is denoted as a red pixel PR), or identified simply as a pixel P, with R, G, B omitted when distinction is unnecessary.

As illustrated in FIG. 1, the display device 100 includes a circuit substrate 10 and a counter substrate 20. The counter substrate 20 is disposed opposed to the circuit substrate 10 with a filling layer 30 in-between (see FIGS. 2 and 3).

The circuit substrate 10 has a display area M, a frame area N around the display area M, and a terminal area T. The display area M has a plurality of pixels P thereon disposed in a matrix. Although only a single pixel P is illustrated in FIG. 1, the pixels P are disposed in the substantially entire display area M. The terminal area T has an integrated circuit chip thereon for driving an element to display an image. A flexible wire substrate or the like (not illustrated) may be connected to the terminal area T for electrical connection to external components.

Figure 2:
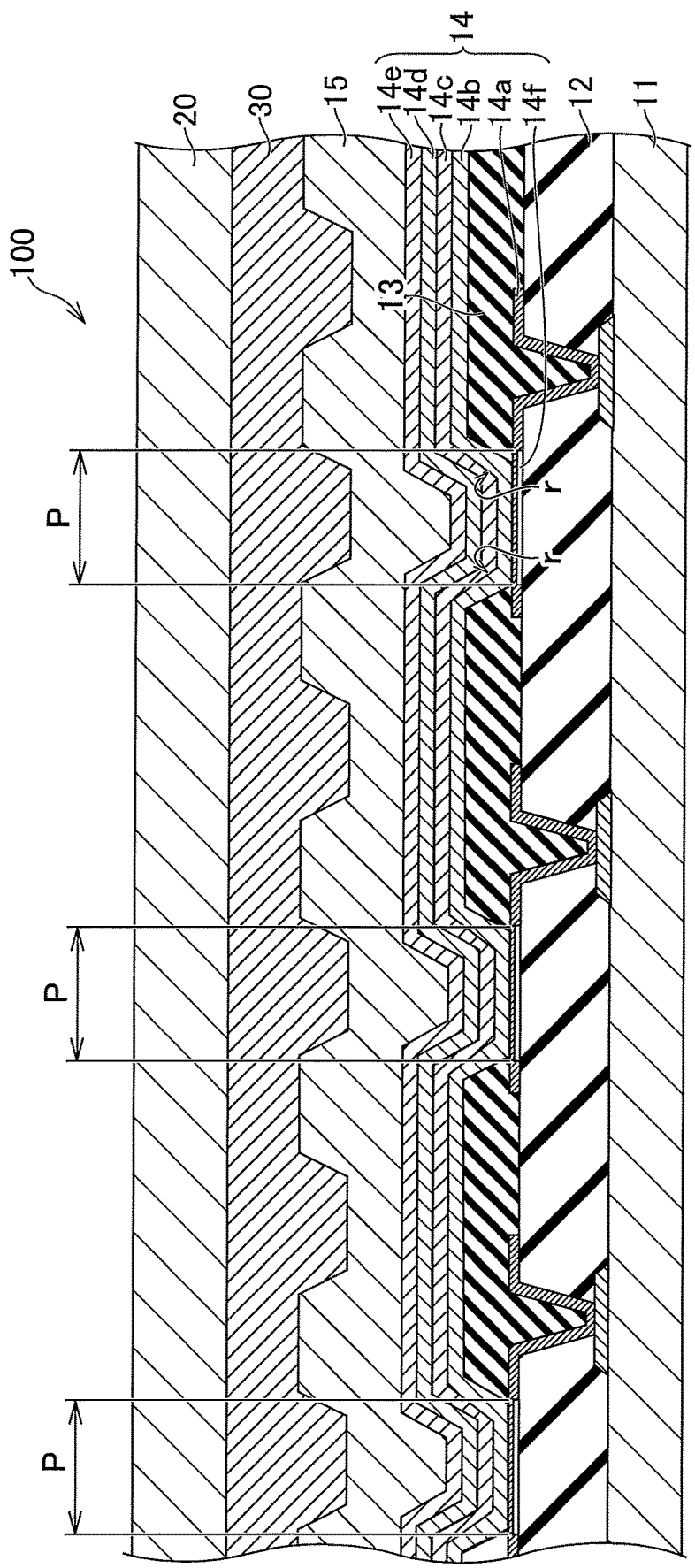
FIG. 2 is a schematic cross-sectional view of a display device according to this embodiment.

FIG. 2 is a schematic cross-sectional view of a display device according to this embodiment. The circuit substrate 10 includes a substrate 11, an insulating planarization layer 12, an insulating bank (an insulating layer) 13, a light emitting element layer 14, and a sealing layer 15. The light emitting element layer 14 includes at least an anode electrode (a lower electrode) 14a, a p-doped hole transport layer (p-doped HTL) 14b, a hole transport layer (HTL) 14c, a light emissive layer (EML) 14d, and a cathode electrode (an upper electrode) 14e.

The substrate 11 can include a thin film transistor and have a glass substrate or resin substrate as a lower layer thereof, with detailed structure thereof not illustrated. The planarization layer 12 is formed on the substrate 11 to make flat the anode electrode 14 and a reflection metal 14f under the anode electrode 14a. The planarization layer 12 may be made of organic material, such as photosensitivity acrylic resin. The bank 13 is formed so as to separately define respective pixels P. Specifically, the bank 13 is formed so as to separate the anode electrode 14a and a part of the light emitting element layer 14 (a p-doped hole transport layer 14b). The bank 13 has an opening, and the anode electrode 14a is partially exposed in the opening. The anode electrode 14a is in contact with the light emitting element layer 14 in an area where the anode electrode 14a is exposed in the opening of the bank 13. The area where the anode electrode 14a is in contact with the light emitting element layer 14 is an area corresponding to a pixel P, and light emission is made in the pixel P. In other words, the width of the area where the anode electrode 14a is in contact with the light emitting element layer 14 (the p-doped hole transport layer 14b) corresponds to the width of the opening of the pixel P.

The light emissive layer 14d is formed, for example, through deposition. The sealing layer 15 prevents invasion of moisture from outside into the light emissive layer 14d and includes at least one inorganic insulating layer made of, for example, silicon nitride (SiN). The sealing layer 15 may have a laminated structure including a plurality of insulating layers. The cathode electrode 14e, the sealing layer 15, and the like, are formed over the substantially entire display area M across a plurality of pixels P. The anode electrode 14a is provided so as to correspond to each of the plurality of pixels P. The anode electrode 14a is electrically connected to a wire layer through a contact hole that penetrates the planarization layer 12.

The anode electrode 14a may be made of transparent material, such as, for example, indium tin oxide (ITO). Under the anode electrode 14a, the reflection metal 14f, such as silver or aluminum, that reflects light may be disposed. The cathode electrode 14e may be made of transparent material, such as ITO, similar to the anode electrode 14a.

Figure 3:
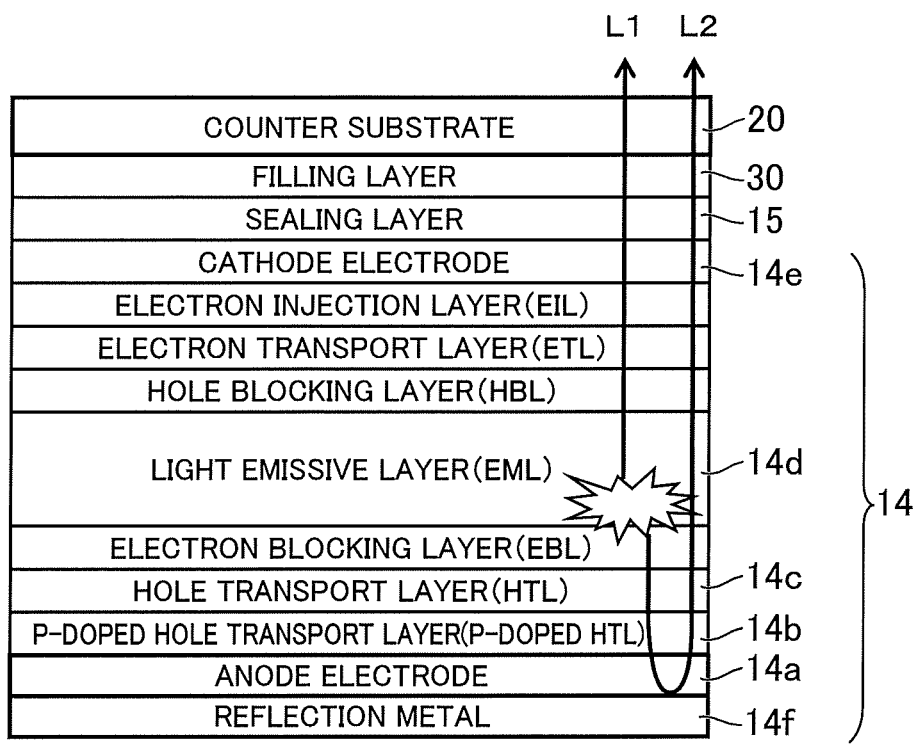
FIG. 3 schematically illustrates the laminated structure of a display device according to this embodiment.

FIG. 3 schematically illustrates the laminated structure of a display device according to this embodiment. The light emitting element layer 14 may include an electron blocking layer (EBL), a hole blocking layer (HBL), an electron transport layer (ETL), an electron injection layer (EIL), as illustrated in FIG. 3, in addition to the above mentioned anode electrode 14a, p-doped hole transport layer 14b, hole transport layer 14c, light emissive layer 14d, cathode electrode 14e, and reflection metal 14f. As illustrated in FIG. 3, these layers may be stacked in the order of the reflection metal 14f, the anode electrode 14a, the p-doped hole transport layer 14b, the hole transport layer 14c, the electron blocking layer, the light emissive layer 14d, the hole blocking layer, the electron transport layer, the electron injection layer, and the cathode electrode 14e from the bottom to the top.

The following describes the light emitting principle for the display device 100. With a voltage applied to the anode electrode 14a and the cathode electrode 14e on the respective upper and lower sides of the light emissive layer 14d, holes having positive charge move from the anode electrode 14a through the p-doped hole transport layer 14b and the hole transport layer 14c into the light emissive layer 14d, while electrons having negative charge move from the cathode electrode 14e through the electron injection layer and the electron transport layer into the light emissive layer 14d. The holes having moved from the anode electrode 14a into the light emissive layer 14d will not move beyond the light emissive layer 14d toward the cathode electrode 14e as being blocked by the hole blocking layer formed on the light emissive layer 14d. Meanwhile, the electrons having moved from the cathode electrode 14e into the light emissive layer 14d will not move beyond the light emissive layer 14d toward the anode electrode 14a as an electron blocking layer is formed under the light emissive layer 14d.

In the light emissive layer 14d, an electron is combined with a hole. The combination generates an energy, which excites particles around. The particles in the excited state return to the ground state. In the return, light is emitted with the energy being discharged. In other words, electrons are re-combined with holes in the light emissive layer 14d, and the recombination excites the organic material forming the light emissive layer 14d. With the excitement, an energy state shifts from a high energy level to a low energy level, whereby light is emitted.

As illustrated in FIG. 3, the light from the light emissive layer 14d partially proceeds toward the display surface (toward the counter substrate 20). The light L1 proceeding toward the display surface is extracted from the display surface to outside the display device 100. Meanwhile, the light proceeding from the light emissive layer 14d partially proceeds in the direction opposite from the display surface. The light L2 proceeding in the direction opposite from the display surface is reflected by the reflection metal 14f, and then extracted from the display surface to outside the display device 100. Alternatively, the reflection metal 14f may be omitted. In this case, the anode electrode 14a is made of material that reflects light, so that the light L2 is reflected on the surface of the anode electrode 14a.

The light emissive layer 14d may be made of material that emits white light. In addition, for example, a color filter is disposed on the counter substrate 20 so as to correspond to each of the pixels P. Use of a color filter that passes red light, a color filter that passes green light, and a color filter that passes blue light enables display of a full-color image. Alternatively, instead of using a color filter, the light emissive layers 14d are formed using materials that emit red, green, and blue respective light beams, and disposed so as to correspond to respective pixels P for the respective colors.

Figure 4A:
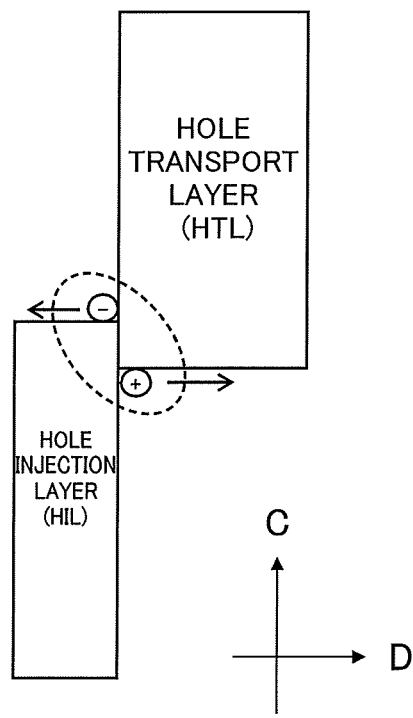
FIG. 4A is a conceptual diagram to explain the mechanism for hole transport according to a conventional technique.
Figure 4B:
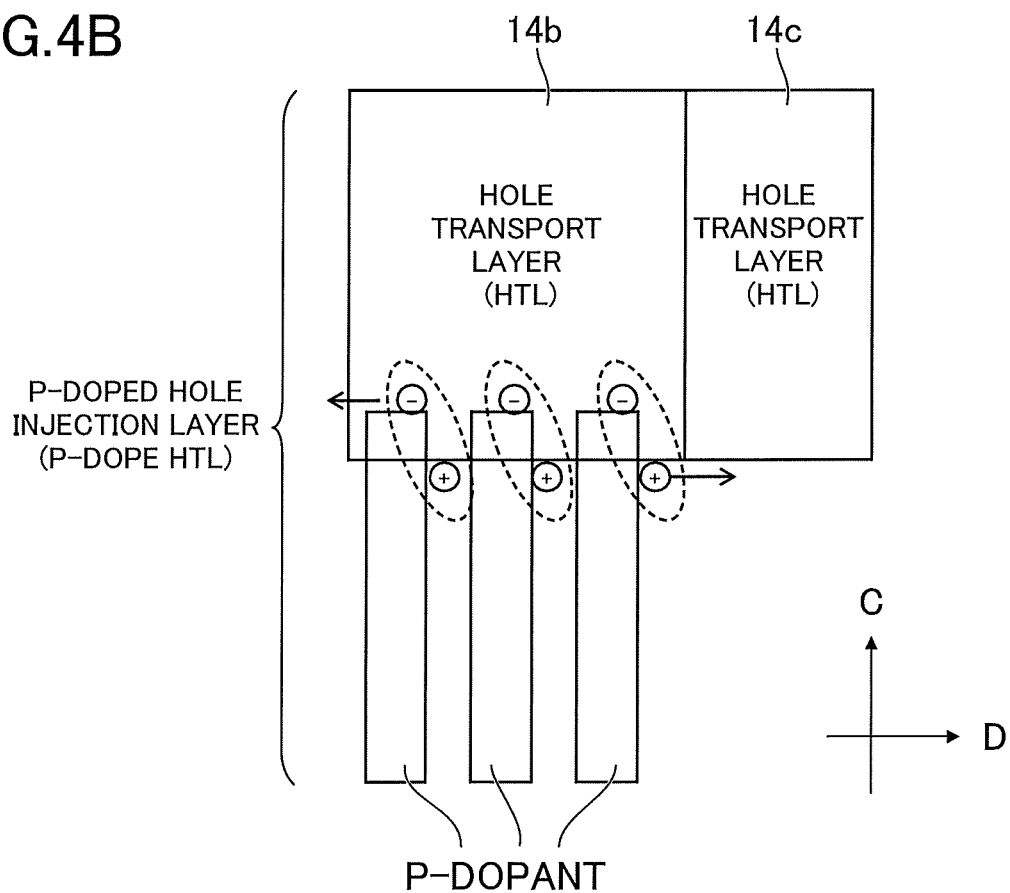
FIG. 4B is a conceptual diagram to explain the mechanism for hole transport according to this embodiment.

The following describes the hole transport mechanism in this embodiment, based on a comparison with conventional technique, while referring to FIG. 4. FIG. 4A is a conceptual diagram to explain a hole transport mechanism according to a conventional technique. FIG. 4B is a conceptual diagram to explain the hole transport mechanism in this embodiment. In FIGS. 4A and 4B, the direction C indicates the magnitude of the energy (eV), in which the side of each layer on the positive side of the direction C corresponds to the Lowest Unoccupied Molecular Orbital (LUMO), while the side of each layer on the negative side of the direction C corresponds to the Highest Unoccupied Molecular Orbital (HUMO). In FIG. 4A and FIG. 4B, the positive side of the direction D corresponds to the cathode electrode 14e side, while the negative side of the direction C corresponds to the anode electrode 14a side.

According to the conventional technique, a hole injection layer (HIL) is formed under the hole transport layer 14c. The hole injection layer generates holes and electrodes through charge separation along the interface relative to an adjacent hole transport layer. The hole injection layer may be made of hole injection material, such as, 3,6,7,10,11-(Hexacyano)-1,4,5,8,9,12-(hexaazatriphenylene) (HAT-CN), copper hexadecafluoro-phthalocyanine ($F_{16}$CuPc), or the like. The LUMO of the hole filling material has a value relatively close to that of the HOMO of the hole transport material forming the hole transport layer.

In this embodiment, a p-doped hole transport layer 14b, that is, a layer formed by injecting p-dopant including organic material into a hole transport layer, is formed under the hole transport layer 14c, instead of a hole injection layer made of the above mentioned hole injection material. The hole transport layer 14c transports holes to the light emissive layer 14d. The p-doped hole transport layer 14b containing p-dopant generates holes and electrons through charge separation in a bulk of the hole transport layer where the p-dopant is contained in the p-doped hole transport layer 14b, and transports the holes to the light emissive layer 14d.

The hole transport material forming the hole transport layer may include, for example, 1-bis-di-4-tolylamino-phenyl-cyclohexane (TAPC), N,N'-bis(3-methylphenyl)-N,N'-diphenylbenzidine (TPD), bis(N-((1-naphtyl)-N-phenyl) benzidine (α-NPD) 4,4',4"-tris(3-methylphenylphenylamino)triphenylamine (m-MTDATA), Triphenylamine-tetramer (TPTE), 2,2',7,7'-tetrakis(N, N-diphenylamino)-9,9'-spirobifluorene (spiro-TAD). P-dopant may be molybdenum oxide ($MoO_3$), rhenium oxide ($Re_2O_7$), fluorinated Tetracyanoquinodimethane ($F_4$-TCNQ). The value of the energy level of the HOMO of the hole transport material is about 5.0 to 5.5 (eV), which is relatively close to that of the LUMO of p-dopant.

With a voltage applied to the anode electrode 14a and the cathode electrode 14e, holes having positive (+) charge and electrons having negative (−) charge are generated through charge separation. As illustrated in FIG. 4A, according to a conventional technique, holes and electrons are generated through charge separation along the interface between the hole transport layer 14c and the hole injection layer, and the holes move toward the cathode electrode 14e (the positive side of the direction D). Meanwhile, in this embodiment, holes and electrons are generated through charge separation in a bulk of the hole transport layer where the p-doped material is contained in the p-doped hole transport layer 14b, and the holes move toward the cathode electrode 14e (the positive side of the direction D).

In a conventional structure, charge separation is caused only along the interface between the hole transport layer 14c and the hole injection layer, while, in this embodiment, charge separation is caused in a bulk of the hole transport layer where the p-dopant is contained in the p-doped hole transport layer 14b. Thus, the latter causes a larger number of occurrences of charge separation. Accordingly, the structure according to this embodiment generates a larger number of holes than that by a structure according to the conventional technique, thus providing higher hole transport capability (hole injecting capability). In other words, the structure according to this embodiment can transport holes toward the light emissive layer 14d with a lower voltage. The larger the amount of p-dopant contained in the p-doped hole transport layer 14b is, the higher the hole transport capability is. Additionally, the larger the amount of p-dopant contained in the p-doped hole transport layer 14b is, the more easily a current can flow between the anode electrode 14a and the cathode electrode 14e. That is, the display device 100 employing the p-doped hole transport layer 14b in this embodiment can adjust the amount of current flowing between the anode electrode 14a and the cathode electrode 14e by adjusting the amount of p-dopant contained.

The hole injection layer may be made of organic material containing fluorine. Fluorine-based particles, however, have low surface tension, and can provide only insufficient adhesion. This rises a problem in that the hole injection layer is easily detached from the anode electrode 14a. Meanwhile, a hole injection layer made of metal or oxide can provide only insufficient permeability. This rises a problem in that light emitting efficiency is low. In view of the above, use of the p-doped hole transport layer 14b containing no fluorine, as in this embodiment, instead of use of a hole injection layer, can solve the problem with adhesion and permeability.

Here, in order to prevent short-circuit between the anode electrode 14a and the cathode electrode 14e, so-called reflow soldering may be executed in the manufacturing process. With reflow soldering, in which a film is melted by heating, foreign matter on the anode electrode 14a is covered, which can prevent occurrence of short-circuit between the anode electrode 14a and the cathode electrode 14e. This can resultantly reduce the number of pixels P that do not light, thus increasing the yield of the display devices 100. Any thermal processing other than soldering may be employed to cover foreign matter on the anode electrode 14a to prevent short-circuit between the anode electrode 14a and the cathode electrode 14e.

Reflow soldering applied after formation of the p-doped hole transport layer 14b on the anode electrode 14a, however, may cause agglomeration of reflow material in an area near the end portion of the opening of the bank 13, as illustrated in FIG. 2. The agglomeration may increase the thickness of an area of the p-doped hole transport layer 14b, the area being near the end portion of the opening. The area of the p-doped hole transport layer 14b that becomes thicker will be referred to as a thick film area r. The thick film area r can be formed as a result of agglomeration of the material forming the p-doped transport layer 14b and melted, the reflow material, or both. In this embodiment, as illustrated in FIG. 2, the end portion of the opening of the bank 13 and the thick film area r of the p-doped hole transport layer 14b define an inclined face. The thick film area r is resulted in an area corresponding to an end portion of a pixel P. A thick film area r is formed on each of the both end portions of a pixel P such that those on the respective end portions face to each other.

In a thick film area r with agglomerated reflow material or other material, the hole transport capability is deteriorated, and a current flows less easily. The current flowing less easily in the area near the end portion of the opening of the bank reduces the substantial width of the opening of a pixel P, and possibly decreases the brightness. The reduced substantial width of the opening of a pixel P leads to requirement of increase in voltage to be applied to the anode electrode 14a and the cathode electrode 14b in order to obtain sufficient brightness for image display. This may ultimately shorten the service life of the display device 100.

In view of the above, in this embodiment, a larger amount of p-dopant is contained in the thick film area r of the p-doped hole transport layer 14b than that in the area between the opposed thick film areas r of all areas constituting a pixel P. This can prevent the current from flowing less easily in the thick film area r of the p-doped hole transport layer 14b, the thick film area r being resulted after reflow soldering, and thus can prevent reduction in substantial width of the opening of the pixel P. That is, it is possible to prevent decrease in brightness of the pixel P. As a result, this does not require excessive increase in voltage to be applied to the anode electrode 14a and the cathode electrode 14b, and thus can prevent shortening of the service life of the display device 100.

The pixel p has a substantially rectangular shape in a plan view, and has a thick film area resulting from agglomeration of reflow material or other material in any of its four end portions. That is, besides one pair of opposed thick film areas r, the pixel P has another pair of opposed thick film areas S (not illustrated in FIG. 2, see FIG. 10). Although a larger amount of p-dopant is contained in the thick film area r of the p-doped hole transport layer 14b than that in the area between the opposed thick film areas r among other areas constituting the pixel P in the example described in the above, this example is not an exclusive example. For example, a larger amount of p-dopant may be contained in at least either one of the film thick areas r and S of the p-doped hole transport layer 14b than that in the area surrounded by the thick film areas (the thick film areas r and S) among all areas constituting the pixel P.

Figure 5:
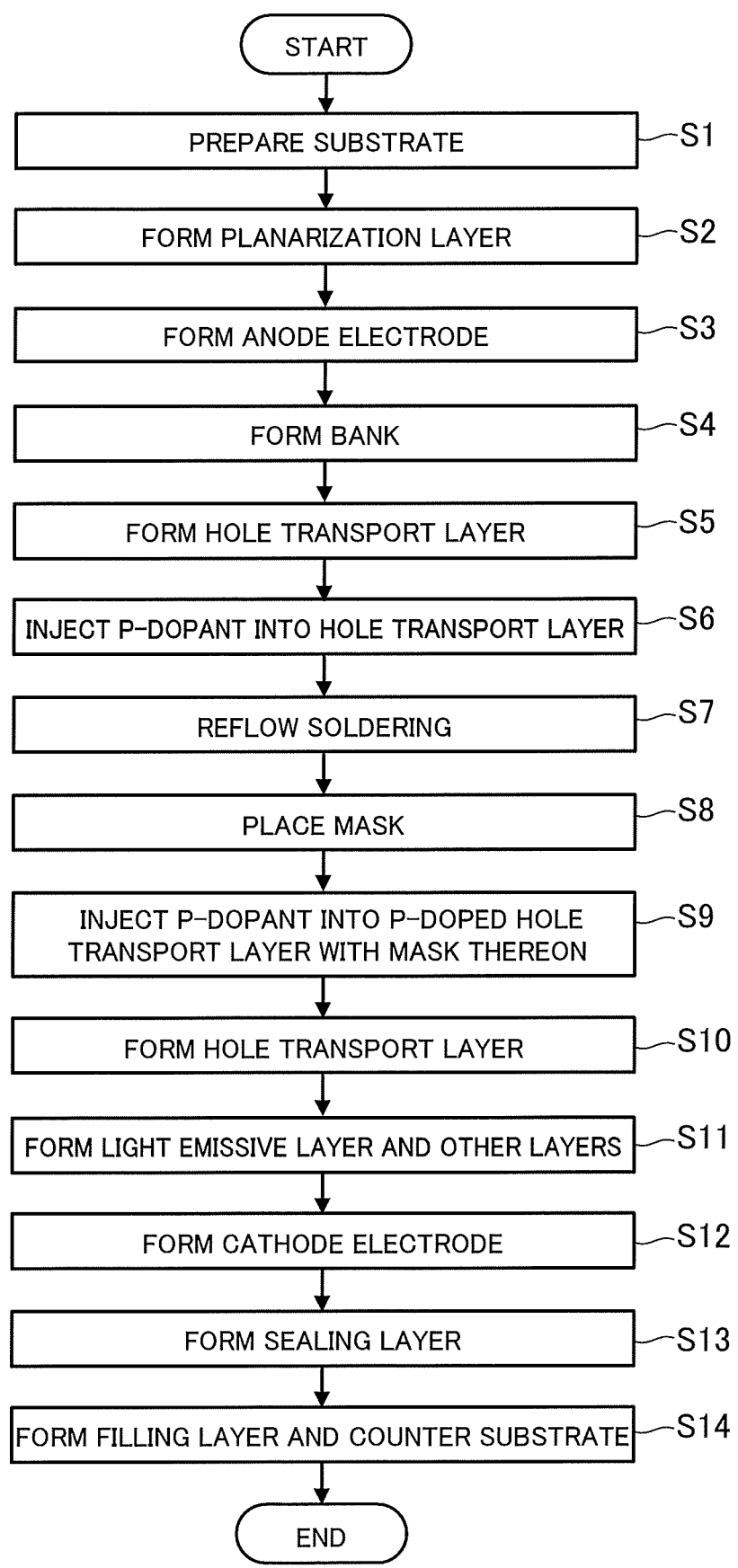
FIG. 5 is a flowchart to explain a method for manufacturing a display device according to this embodiment.
Figure 6:
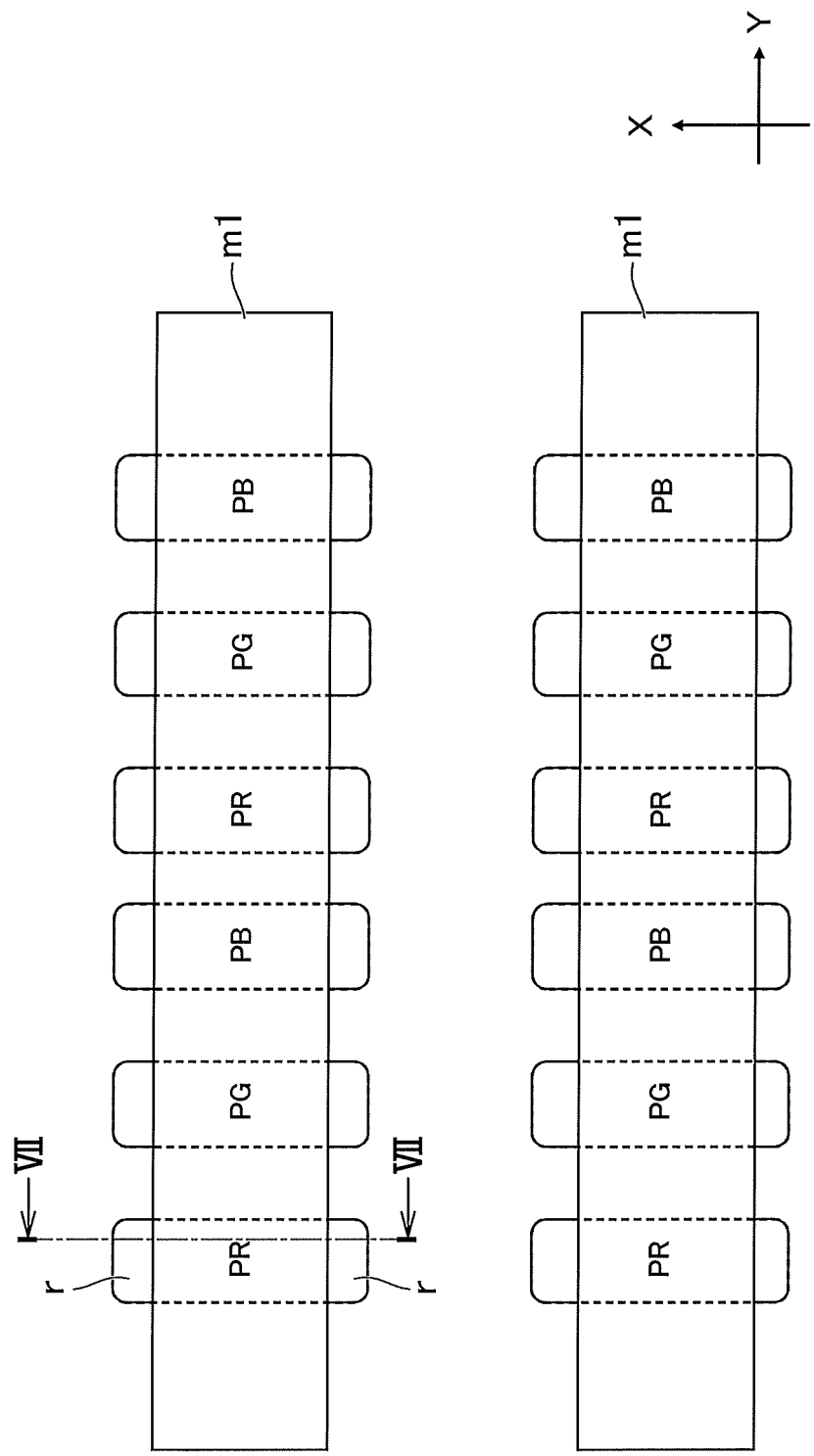
FIG. 6 is a plan view to explain a process of injecting p-dopant into a p-doped hole transport layer in this embodiment.
Figure 7:
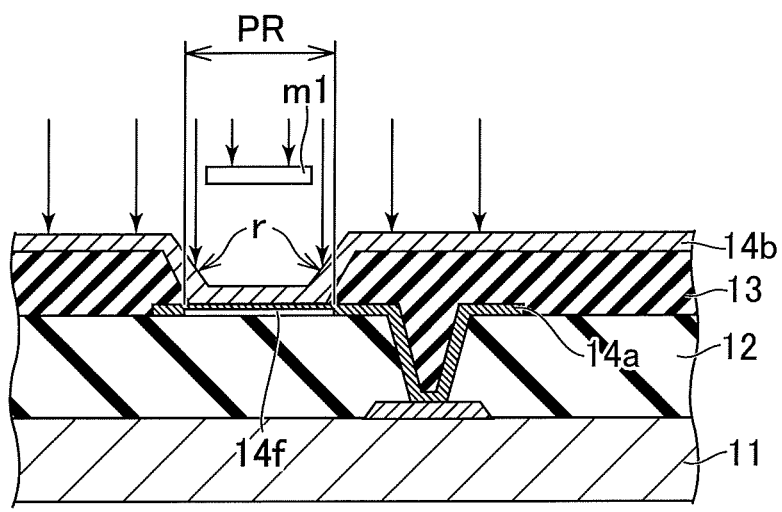
FIG. 7 is a cross-sectional view along the line VII-VII in FIG. 6.

The following describes a method for manufacturing a display device 100 according to this embodiment, referring to FIGS. 5 to 7.

FIG. 5 is a flowchart to explain a method for manufacturing a display device according to this embodiment. Initially, the substrate 11 is prepared (step S1). The planarization layer 12 is formed on the substrate 11 (step S2). The anode electrode 14a is formed on the planarization layer 12 (step S3). The bank 13 is formed on the planarization layer 12 and the anode electrode 14a. The bank 13 separately defines adjacent pixels P and includes an opening, in which the anode electrode 14a is partly exposed, is formed (step S4). A hole transport layer is formed across the plurality of pixels P (step S5).

P-dopant is injected into the hole transport layer to thereby form a p-doped hole transport layer 14b containing p-dopant across the plurality of pixels P (step S6). Reflow processing (thermal processing) is applied to the p-doped hole transport layer 14b on the anode electrode 14a (step S7). In the above, reflow material agglomerates in the p-doped hole transport layer 14b in an area near the end portion of the opening of the bank 13, whereby a thick film area r is resulted. Although reflow soldering is executed immediately after formation of the p-doped hole transport layer 14b in this embodiment, this is not an exclusive example, and reflow soldering may be executed at any timing after formation of the p-doped hole transport layer 14b.

Then, a mask is placed on the pixel P (step S8). P-dopant is injected into the p-doped hole transport layer 14b through the mask (step S9). A mask made of metal, for example, can be used.

The below describes details on the process of injecting p-dopant through the mask at steps S8 and 9 in FIG. 5, with reference to FIGS. 6 and 7. FIG. 6 is a plan view to explain the process of injecting p-dopant into the p-doped hole transport layer in this embodiment. FIG. 7 is a cross-sectional view along the line VII-VII in FIG. 6. The pixels P (PR, PG, PB) in FIG. 6 correspond to the portions of the anode electrode 14a that are exposed in the openings of the bank 13. Although the p-doped hole transport layer 14b is actually formed across a plurality of pixels P, only the thick film area r is illustrated in FIG. 6 with the remaining area not illustrated. Also in FIGS. 8 and 10 to 13 to be described later, only the thick film area r or S is illustrated with the remaining area not illustrated. The direction in which the pixels P are aligned is referred to as the Y direction; the direction perpendicular to the direction in which the pixels P are aligned is referred to as the X direction; and the pixel P has a substantially rectangular shape that is long in the X direction. Each pixel P (PR, PG, PB) may have any shape and be positioned anywhere, not limited to those illustrated in FIG. 6 and FIG. 8, FIGS. 10 to 13 to be described later.

According to the method for manufacturing display devices in this embodiment, as illustrated in FIGS. 6 and 7, a mask m1 is placed across adjacent pixels P but not on the thick film area r (an area near the end portion of the opening of the bank 13) (step S8). FIG. 7 illustrates the mask m1 placed on the area between opposed thick film areas r in a red pixel PR. In other words, the mask m1 is placed in a part of the anode electrode 14a that is exposed in the opening of the bank 13. With the mask m1 placed as described above, a process of injecting p-dopant into the p-doped hole transport layer 14b is executed (step S9). The arrows in FIG. 7 indicate the direction in which the p-dopant moves. Additional p-dopant is not injected in a portion of the red pixel PR covered by the mask m1, but injected in a portion of the p-doped hole transport layer 14b not covered by the mask m1. In other words, injecting p-dopant through the mask m1 enables injection of additional p-dopant in the portion of the p-doped hole transport layer 14b in the thick film area r and on the bank 13. This increases the concentration of the p-dopant in these areas.

Thereafter, the hole transport layer 14c is formed across a plurality of pixels P on the p-doped hole transport layer 14b (step S10). Additionally, the electron blocking layer, the light emissive layer 14d, the hole blocking layer, the electron transport layer, and the electron injection layer are stacked sequentially from the lower layer (step S11) before formation of the cathode electrode 14e and the sealing layer 15 sequentially thereon (steps S12 and S13). Thereafter, the filling layer 30 and the counter substrate 20 are formed in this order on the sealing layer 15 (step S14).

The display device 100 made by the manufacturing method described with reference to FIGS. 6 and 7 can prevent a current from flowing less easily in the thick film area r. This can prevent reduction in substantial width of the opening of the pixel p.

Here, any mask having a variety of structures can be used in the process of injecting p-dopant into the p-doped hole transport layer 14b. The below describes the structures of modified examples of a mask usable in the process of injecting p-dopant into the p-doped hole transport layer 14b and a p-doped hole transport layer formed with use of such masks.

Figure 8:
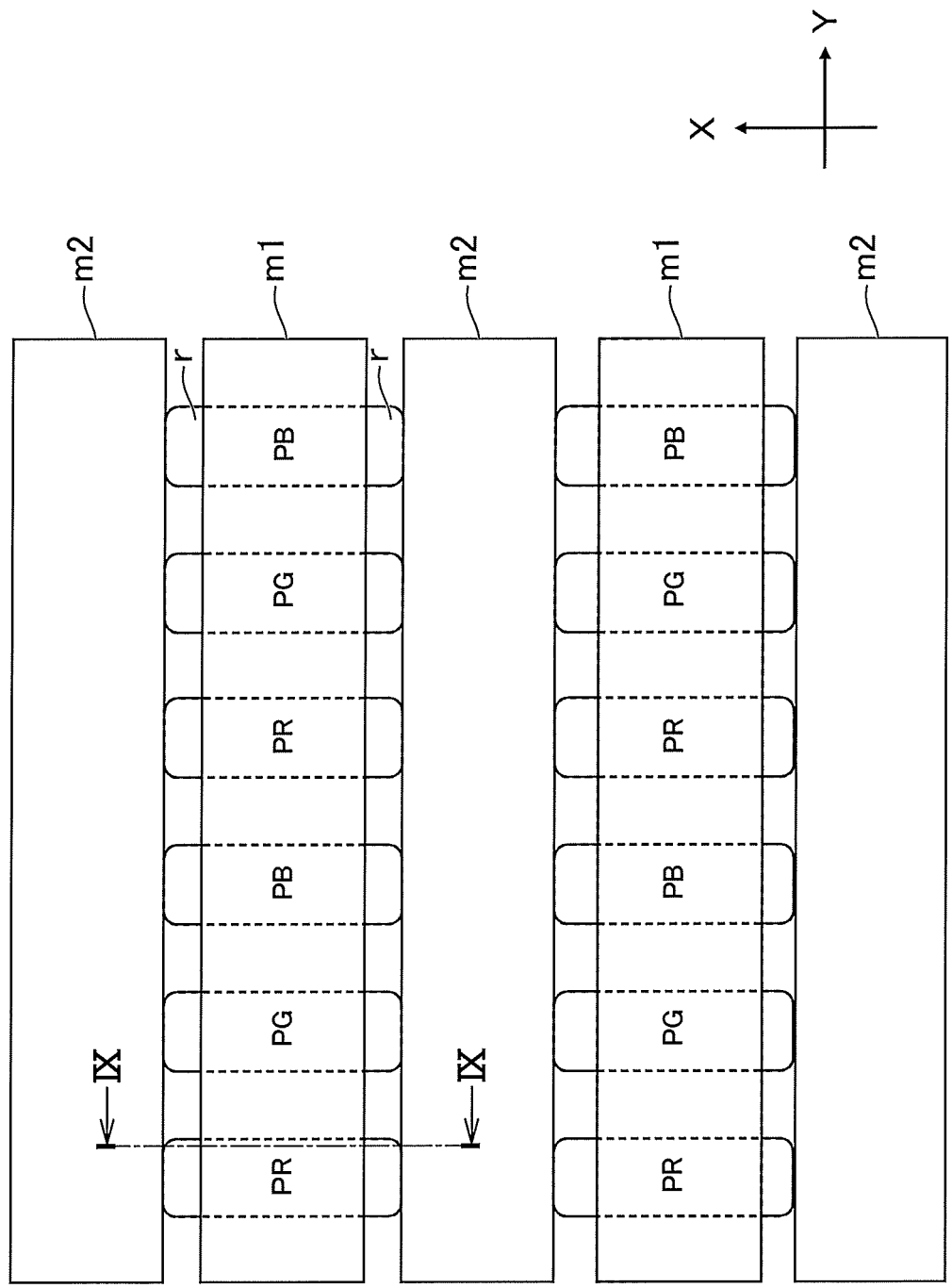
FIG. 8 is a plan view to explain a process of injecting p-dopant into a p-doped hole transport layer in a first modified example.
Figure 9:
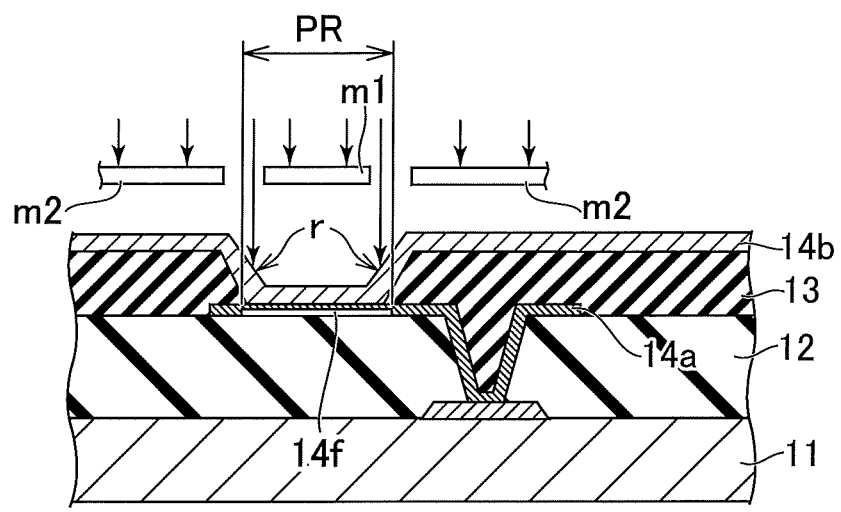
FIG. 9 is a cross-sectional view along the line IX-IX in FIG. 8.

FIG. 8 is a plan view to explain a process of injecting p-dopant into the p-doped hole transport layer in a first modified example. FIG. 9 is a cross-sectional view along the line IX-IX in FIG. 8.

The p-doped hole transport layer 14b has higher hole transport capability when containing a larger amount of p-dopant. Accordingly, if a large amount of p-dopant is contained in the portion of the p-doped hole transport layer 14b between adjacent pixels P, holes may move to the adjacent pixels P through the p-doped hole transport layer 14b. This may cause unintended light emission from the adjacent pixels P. This causes color mixture, and possibly deteriorates color purity and contrast. As a result, the display quality can be deteriorated.

In view of the above, in the first modified example, a mask m2 is placed on the p-doped hole transport layer 14b in addition to the mask m1 illustrated in FIGS. 6 and 7 (step S8 in FIG. 5) before injecting p-dopant into the p-doped hole transport layer 14b (step S9 in FIG. 5). Specifically, a mask m2 is placed on the area of the p-doped hole transport layer 14b on the bank 13. In other words, the mask m2 is placed on the area between adjacent pixels P. This placement of the mask m2 enables injection of p-dopant only into the thick film area r of the p-doped hole transport layer 14b, but not into the portion of the p-doped hole transport layer 14b on the bank 13. That is, the display device 100 made through the process with the masks m1 and m2 can prevent leakage of holes into adjacent pixels, the hole leakage being possibly caused when a large amount of p-dopant is contained in the portion of the p-doped hole transport layer 14b on the bank 13. This can prevent color mixture, and thus can improve display quality.

FIG. 10 is a plan view to explain a process of injecting p-dopant into the p-doped hole transport layer in a second modified example. In FIGS. 6 and 8, a mask is placed so that p-dopant is additionally injected into an end portion of the pixel P in the X direction in the drawing. In a second modified example, a mask m3 is placed so that p-dopant is additionally injected into an end portion of the pixel P in the Y direction in the drawing. That is, the mask m3 is placed so that p-dopant is additionally injected into the thick film area S of the p-doped hole transport layer 14b (steps S8 and S9 in FIG. 5). As illustrated in FIG. 10, the mask m3 may be placed across adjacent pixels P in the X direction. That is, the display device 100 made through the process with the mask m3 can prevent reduction in substantial width of the opening of the pixel p in the direction (in the Y direction in the drawing) perpendicular to the longitudinal direction of the pixel P. Note that the thick film area S is resulted from agglomeration of soldering material or the like, and defines an inclined face along the inclined face of the end portion of the opening of the bank 13, with a cross section thereof not illustrated, similar to the thick film area r illustrated in FIG. 2 and other figures.

FIG. 11 is a plan view to explain a process of injecting p-dopant into the p-doped hole transport layer in a third modified example. In the third modified example, a mask m4 is placed on the p-doped hole transport layer 14b in addition to the mask m3 illustrated in FIG. 10 (step S8 in FIG. 5), and p-dopant is injected into the p-doped hole transport layer 14b with the masks so placed (step S9 in FIG. 5). Specifically, the mask 4 is placed in the area between adjacent pixels P in the Y direction in the drawing. That is, the display device 100 made through the process with the mask m4 can prevent leakage of holes into adjacent pixels, the leakage of holes being possibly caused when a large amount of p-dopant is contained in the portion of the p-doped hole transport layer 14b on the bank 13. This can prevent color mixture, and thus can improve display quality. Specifically, use of the mask m4 can prevent color mixture between adjacent red and green pixels PR and PG, between adjacent green and blue pixels PG and PB, and between adjacent blue and red pixels PB and PR. Whereas a significant deterioration in display quality will result in particular when adjacent pixels emit light in different colors, use of the mask m4 in the third modified example can prevent deterioration in display quality.

FIG. 12 is a plan view to explain a process of injecting p-dopant into a p-doped hole transport layer in a fourth modified example. In the fourth modified example, a mask m5 is placed on the p-doped hole transport layer 14b in an area other than the thick film area r. As illustrated in FIG. 12, the mask m5 has an opening only at a position corresponding to the thick film area r. The mask m5 is placed on the P-doped hole transport layer 14b (step S8 in FIG. 5), and the process of injecting p-dopant (step S9 in FIG. 5) is executed with the mask m5 so placed so that p-dopant is additionally injected only into the thick film area r of the p-doped hole transport layer 14b. That is, a larger amount of p-doped is contained only in the thick film area r of the p-doped hole transport layer 14b than that in other areas. The display device 100 made through the process with the mask m4 can prevent reduction in substantial width of the opening of the pixel P, and can prevent holes from leaking to adjacent pixels P in the Y and X respective directions.

FIG. 13 is a plan view to explain a process of injecting p-dopant into the p-doped hole transport layer in a fifth modified example. In the fifth modified example, a mask m6 is placed on an area other than the thick film area S of the p-doped hole transport layer 14b. As illustrated in FIG. 13, the mask m6 has an opening formed only at a position corresponding to the thick film area S. The mask m6 is placed on the p-doped hole transport layer 14b (step S8), and the process of injecting additional p-dopant is executed with the mask m6 so placed (step S9) so that the p-dopant is additionally injected only into the thick film area S of the p-doped hole transport layer 14b. That is, a larger amount of p-dopant is contained only in the thick film area S of the p-doped hole transport layer 14b than that in other area. The display device 100 made through the process with the mask m6 can prevent reduction in substantial width of the opening of the pixel P, and can prevent holes from leaking to adjacent pixels in the Y and X respective directions.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
a light emitting element layer including:
  a lower electrode,
  an insulating layer formed on the lower electrode and having an opening, in which the lower electrode is partially exposed, a surface of the opening comprises an end region provided around a boundary edge of the bottom most portion of the opening, and a central region provided inside the end region and closer to the center of the opening in a plane view,
  a p-doped hole transport layer containing p-dopant formed on the insulating layer and the lower electrode in the opening including the end region and the central region,
  a light emissive layer formed on the p-doped hole transport layer, and
  an upper electrode formed on the light emissive layer, wherein
  a first concentration of the p-dopant in the end region is higher than a second concentration of the p-dopant in the central region.

2. The display device according to claim 1, wherein the p-doped hole transport layer has a thick film area in the area close to the end portion of the opening of the insulating layer, and contains a larger amount of p-dopant in the thick film area than an amount of p-dopant in the other areas, the thick film area having a first film thickness that is thicker than a second film thickness of the other areas of the p-doped hole transport layer.

3. The display device according to claim 2, wherein
the end portion of the opening of the insulating layer defines an inclined face, and
the thick film area is formed on the inclined face.

4. The display device according to claim 2, further comprising a plurality of pixels, wherein
the thick film area is formed in an area corresponding to each of end portions of the plurality of pixels.

5. The display device according to claim 1, wherein
the insulating layer has a side wall surrounding the opening, a concentration of the p-dopant on the side wall is the same of the first concentration of the p-dopant on the end region.

6. The display device according to claim 1, wherein
the insulating layer has a side wall surrounding the opening, the side wall is tapered to become narrower toward the lower electrode.

* * * * *